(12) United States Patent
Evans

(10) Patent No.: US 8,138,761 B2
(45) Date of Patent: Mar. 20, 2012

(54) RECEIVER FOR A WIRELESS MAGNETIC RESONANCE IMAGING SCANNER WITH NOTCH-FILTERS AND A 90° HYBRID COUPLERS FORMING A COMPLETE CIRCUIT LOOP

(75) Inventor: Mark Evans, Eastleigh (GB)

(73) Assignee: Siemens Aktiengesellschaft, Munich (DE)

( * ) Notice: Subject to any disclaimer, the term of this patent is extended or adjusted under 35 U.S.C. 154(b) by 11 days.

(21) Appl. No.: 12/612,842

(22) Filed: Nov. 5, 2009

(65) Prior Publication Data

US 2010/0117651 A1    May 13, 2010

(30) Foreign Application Priority Data

Nov. 12, 2008  (GB) .................................. 0820686.4
Mar. 5, 2009   (GB) .................................. 0903724.3
Mar. 11, 2009  (GB) .................................. 0904136.9

(51) Int. Cl.
    *G01V 3/00*    (2006.01)
(52) U.S. Cl. ....................................... 324/318; 324/322
(58) Field of Classification Search .......... 324/300–322;
    600/410, 411, 422, 423; 333/202, 219–235
    See application file for complete search history.

(56) References Cited

U.S. PATENT DOCUMENTS

| | | | |
|---|---|---|---|
| 3,287,629 A * | 11/1966 | Varian | 324/310 |
| 3,480,888 A * | 11/1969 | Elliott | 333/202 |
| 3,524,127 A * | 8/1970 | Greenwood, Jr. et al. | 324/304 |
| 3,530,374 A * | 9/1970 | Waugh et al. | 324/311 |
| 4,737,713 A | 4/1988 | Danby et al. | 324/307 |
| 5,347,222 A * | 9/1994 | Fox et al. | 324/322 |
| 5,389,880 A | 2/1995 | Mori | 324/318 |
| 7,701,220 B2 * | 4/2010 | Ehnholm | 324/322 |
| 2003/0203717 A1 * | 10/2003 | Chuprun et al. | 455/12.1 |
| 2004/0137872 A1 | 7/2004 | Srinivasan | 455/344 |
| 2009/0230966 A1 * | 9/2009 | Ehnholm | 324/322 |
| 2010/0001725 A1 | 1/2010 | Van Liere | 324/307 |
| 2010/0117651 A1 * | 5/2010 | Evans | 324/322 |
| 2010/0253345 A1 * | 10/2010 | Vester | 324/316 |
| 2010/0253346 A1 * | 10/2010 | Hulbert | 324/316 |

* cited by examiner

*Primary Examiner* — Brij B Shrivastav
*Assistant Examiner* — Tiffany Fetzner
(74) *Attorney, Agent, or Firm* — Schiff Hardin LLP

(57) ABSTRACT

A receiver for a wireless magnetic resonance imaging system comprises a pair of substantially identical notch filters (22, 23) each having an input and output and first and second 90 degree hybrid couplers (21, 24). The notch filters are coupled together at each input and output by the first and second 90 degree hybrid couplers respectively.

10 Claims, 4 Drawing Sheets

RECEIVER FOR A WIRELESS MAGNETIC RESONANCE IMAGING SCANNER WITH NOTCH-FILTERS AND A 90° HYBRID COUPLERS FORMING A COMPLETE CIRCUIT LOOP

BACKGROUND OF THE INVENTION

1. Related Applications

The present application is related to the following applications filed simultaneously herewith and having the respective Ser. Nos. 12/612,831 and 12/612,856 and 12/613,004 and 12/613,033 and 12/613,982.

2. Field of the Invention

This invention relates to a receiver for a wireless magnetic resonance imaging (MRI) scanner, in particular to a twin sideband receiver with immunity to interference at local oscillator (LO) frequency and good input match.

3. Description of the Prior Art

MRI scanners use a combination of a strong constant magnetic field ($B_0$) from a superconducting magnet which is modified by gradient fields generated by gradient coils, together with a rotating magnetic field ($B_1$) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The coils that receive signals from the back of the patient are mounted in the patient table. Coils that receive signals from the front of the patient are arranged into 'blankets' that are carefully placed over the patient. Associated with each blanket is a flexible cable containing one co-axial line for each local coil. The cables may interact with the $B_1$ field and with the signals generated from the patient so 'traps' (high impedance sections) must be included at regular (typically $\lambda/8$) intervals. These add cost and inconvenience to the structure.

In use, the requirement to connect the cables and sterilize them between scanning one patient and the next leads to increased down-time between scans. It is therefore desirable that the cables be eliminated.

SUMMARY OF THE INVENTION

In accordance with a first aspect of the present invention a receiver for a wireless magnetic resonance imaging system has a pair of substantially identical notch filters each having an input and output; and first and second 90 degree hybrid couplers; wherein the notch filters are coupled together at each input and output by the first and second 90 degree hybrid couplers, respectively.

Preferably, the receiver further has an amplifier between the first 90 degree hybrid coupler and each of the notch filters.

Preferably, the receiver further has an amplifier between each of the notch filters and the second 90 degree hybrid coupler.

Preferably, the second hybrid coupler is connected to a down converter.

Preferably, the downconverter has a pair of mixers to mix a local oscillator signal with signals output from the second hybrid coupler.

Preferably, the downconverter further has a third 90 degree hybrid coupler to receive signals output from the mixers and to output downconverted upper and lower sidebands of a magnetic resonance signal.

Preferably, the downconverter further has a fourth 90 degree hybrid coupler between the second hybrid coupler and the mixers.

Preferably, the notch filters are designed to filter out a local oscillator signal set at a frequency in the frequency band of 2.400 GHz to 2.4835 GHz.

Preferably, the notch filter is set to filter out a local oscillator signal set at a frequency of substantially 2.442 GHz.

In accordance with a second aspect of the present invention, a wireless magnetic resonance imaging system has a magnet; gradient coils; a number of local coils; a local oscillator and a receiver according to the first aspect.

DESCRIPTION OF THE PREFERRED EMBODIMENTS

The present invention enables a wireless solution to the problems of interference and the hygiene issues associated with the use of a conventional wired system. The wireless concept to which the features of the present invention apply is based on upconversion of the RF (Larmor) frequency signals to microwave frequencies and transmission from local coils located in the patient blanket to microwave antennas located on the bore of the scanner. The combination of transmit and receive antennas on the patient and bore respectively constitutes a MIMO (Multiple Input/Multiple Output) system that allows individual signals from the patient antennas to be resolved. A wireless system greatly enhances the utility of MRI scanners by removing the requirement for cable connections to patient coils and gives rise to significant work flow benefits from eliminating the need to sterilize, connect and disconnect the cables. With no reduction of bore size, an increased coil density above the current norms may be achieved, as well as improving scanner workflow.

It is proposed to use parametric amplifiers to perform the upconversion of the local coil signals from the Larmor frequency to microwave frequencies. The parametric amplifiers are designed to receive their pump signal through a microwave antenna. In order to facilitate this, the pump (or local oscillator, LO) signal must be transmitted from one or more microwave antennas on or near to the inner surface of the MRI bore.

Figure 1:
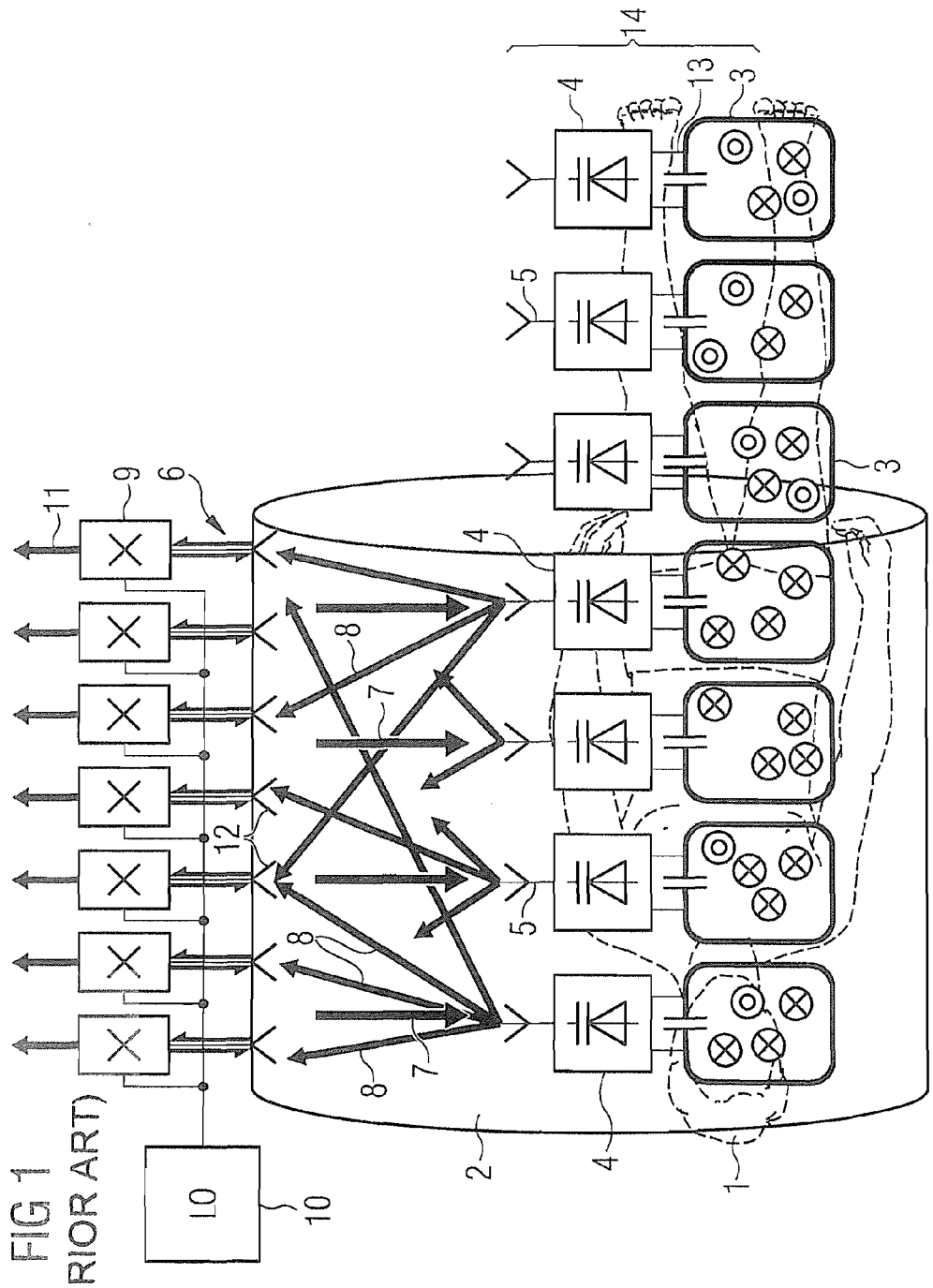
FIG. 1 illustrates a wireless MRI system of the type in which a receiver in accordance with the present invention can be incorporated.

FIG. 1 shows a patient 1 within an MRI scanner bore tube 2. A blanket covers the patient and embedded in the blanket are a plurality of local coils 3. Each local coil 3 has an associated upconverter 4 and microwave antenna 5. Transceivers 9 comprising local oscillator (pump, LO) signal transmitter and microwave down converting receiver are connected to an array 6 of antennas 12 integrated into the scanner bore 2. The frequency upconverter 4 for each patient mat coil 3 produces signals for transmission to the array of transceivers 9 in the scanner bore 2. A local oscillator signal, in this example at a frequency of 2.442 GHz, generated in a separate LO 10 and launched from the transceivers 9 via antennas 12 of the antenna array 6 illuminates the patient coil electronics 14 with a signal 7 at the local oscillator frequency. The same local oscillator signal in the transceivers 9 converts the microwave signals 8, received from the patient coils 3 at the LO frequency ±63 MHz, back to the original magnetic resonance (MR) frequency of 63 MHz for input 11 to the MR receivers (not shown). The local coil upconverters 4 are based on parametric amplifiers and implement low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6.

With a wireless solution that permits the cables to be eliminated, it is also desirable that the wireless solution is able to substantially satisfy all the requirements of the existing system, particularly in the area of noise figure. The receivers of the upconverted signals from the parametric amplifiers have to operate in the presence of the radiated local oscillator. Indeed in some cases the receive antenna may also operate as a transmit antenna for the local oscillator. In this situation the local oscillator may appear at the receiver input at a strong level. Even if the receive antenna does not also serve as a transmit antenna for the local oscillator, it is likely that surrounding antennas may do so and these antennas may have strong mutual coupling with the receive antenna, particularly (in the case of dipoles) from those antennas that are parallel, in line, and adjacent to the receive antenna.

In addition to the above requirement, the receiver needs to provide good noise figure performance. Furthermore, the suppression of multipath inside the MRI bore requires that all of the antennas see a good impedance match at the local oscillator frequency and at the upper and lower sideband receive frequencies.

One method of mitigating the high level signal handling difficulty that arises from the presence of the local oscillator is to introduce into the reception path a notch filter that is tuned specifically to reject this frequency, with a bandwidth such that it passes the upper and lower sidebands substantially without attenuation. This can be introduced either before, or after, an initial low noise amplifier. A conventional passive notch filter as assumed here operates by reflecting signals, at or near to the nominal notch frequency, back from its input. Thus, by definition, a notch filter does not present a good impedance match at its notch frequency. Therefore, placing a notch filter directly at the receiver input does not satisfy the requirement for good impedance match at the local oscillator frequency. Placing the notch filter after the initial low noise amplifier gives a better impedance match because the amplifier provides some buffering between its input and output. However, dynamic range optimization suggests that the amplifier gain at this stage should be relatively low, so the buffering may not be particularly effective and, in general, the match at the amplifier input at the local oscillator frequency will still be quite poor. Furthermore, the amplifier must be able to handle the full power of the unattenuated local oscillator at its input and its amplified output. Another issue with conventional solutions, such as using a diplex or triplex filter, is that at the operating frequencies involved in MRI scanners (approximately 63 MHz in 2.5 GHz), filters with a sufficiently sharp cut off are not available.

Figure 2:
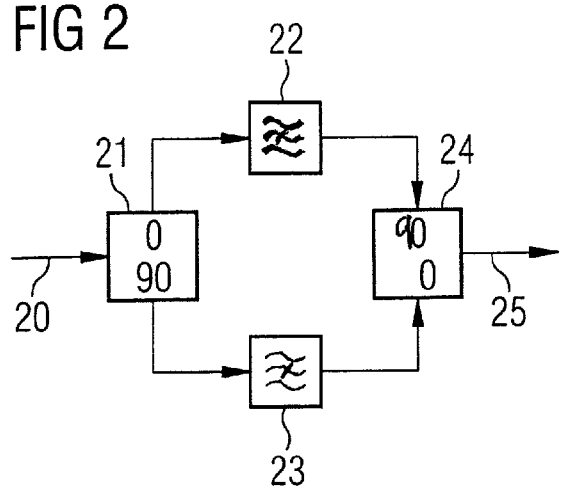
FIG. 2 illustrates an example of a receiver according to the present invention incorporating a matched input impedance notch filter for use in the system of FIG. 1.

The present invention uses a receiver in which a pair of notch filters is coupled together by 90° hybrid couplers as illustrated in FIG. 2. A first 90° hybrid coupler 21 has an input 20. The coupler 21 couples two notch filters 22, 23 which are chosen to be substantially identical, although in practice, at the frequency of interest, there are likely to be differences between different manufactured batches. Outputs of the notch filters are coupled by a second 90° hybrid coupler 24. This arrangement nominally provides a good input impedance match even at the notch frequency based on the balance of the circuit. In practice, the match is only as good as the matching of the notch filters. Because these are typically components that are highly frequency selective, the matching will tend to be good at frequencies away from the notch frequency, but to degrade somewhat as the notch frequency is approached.

Figure 3:
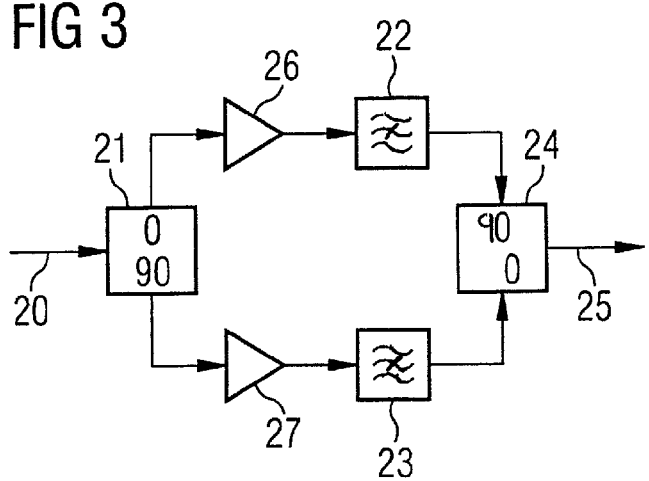
FIG. 3 illustrates the receiver of FIG. 2 with front end low noise amplifiers.

Thus, whilst this approach is advantageous, further improvements may be required. One extension is to introduce a low noise amplifier before the arrangement of FIG. 2. However, the amplifier must still be able to handle the full power of the unattenuated local oscillator at its input and its amplified output. An alternative arrangement that mitigates the problem described above is shown in FIG. 3. The arrangement of FIG. 2 is modified by introducing low noise amplifiers 26, 27 between the input 90° hybrid coupler 21 and the notch filters 22, 23. Now these amplifiers only have to handle one half of the power that would be required in the arrangement of FIG. 2. This benefit is obtained at the expense of having two amplifiers rather than one, so that the total power handling requirement is the same. However, in situations where high linearity is required whilst retaining low noise figure, this arrangement may still be advantageous. Moreover, the amplifiers provide some buffering of the notch filter input impedance as described earlier so that the matching between the impedances, seen at the input 20 of the input 90° hybrid coupler 21, is improved. Thus, the overall effect of this arrangement is to provide the required notch filtering, good impedance matching and low noise figure as required.

Figure 4:
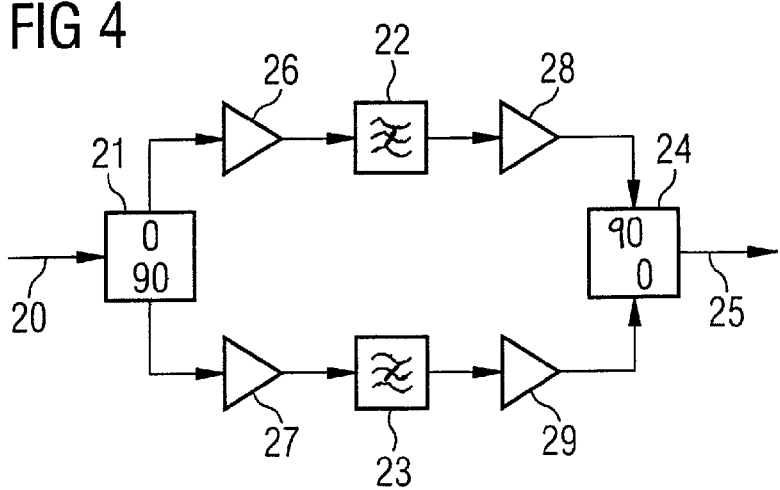
FIG. 4 shows an example of the receiver of FIG. 2 with front and back end low noise amplifiers.

Another implementation includes further low noise amplifiers after the notch filters as shown in FIG. 4. In FIG. 4, as well as the amplifiers 26, 27 of FIG. 3, additional low noise amplifiers 28, 29 are introduced. The advantage of this particular arrangement is that the gain of the amplifiers 26, 27 before the notch filters 22, 23 can be reduced, thereby easing their output large signal handling requirement, without compromising noise figure performance. In a tradeoff between dynamic range and noise figure an alternative, not shown here, is to provide amplifiers after the notch filters, but not before. The amplifiers 28, 29 that follow the notch filters 22, 23 benefit from their attenuation of the strong local oscillator signal, so that typically their large signal handling requirement is reduced. Specifically, if the depth of the notch exceeds the gain of the first amplifiers 26, 27 preceding the notch filters 22, 23, then the large signal handling requirement of the second amplifiers 28, 29 will be no more demanding than that for the first amplifiers. Depending on the actual notch depth it may be possible, in principle, to use second amplifiers that actually have worse large signal handling performance than the first amplifiers. However, this is unlikely to be desirable in practice because a reasonably good large signal handling at the upper and lower sideband frequencies is still required.

The preferred architecture for the back end of the receiver, where down conversion is carried out, is direct conversion that uses the same local oscillator signal as is generating interference at the input, for the down conversion. Because the wanted signal is at the Larmor frequency, although the configuration is technically direct conversion, there are no output signals close to DC.

Figure 5:
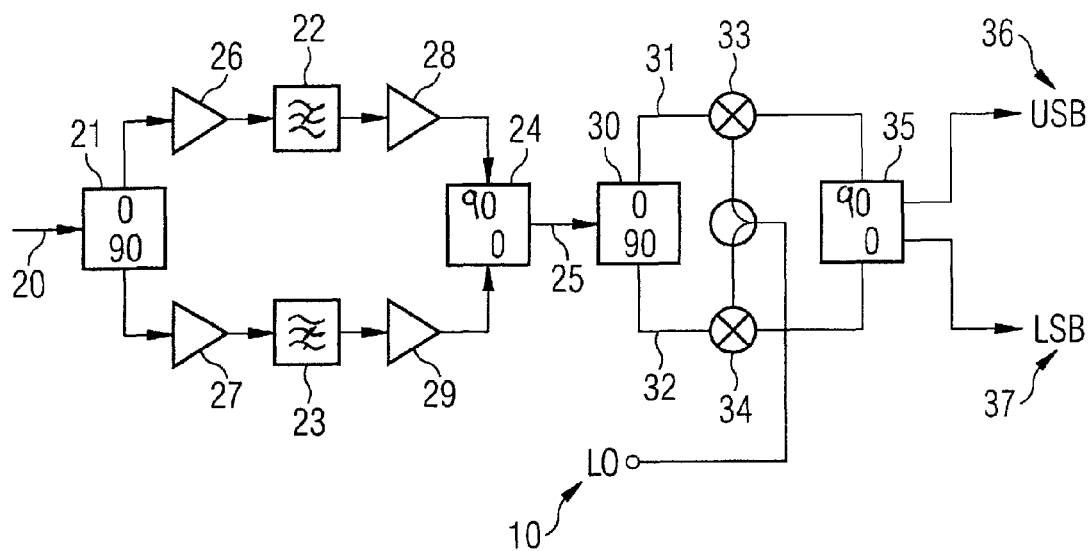
FIG. 5 illustrates the receiver of FIG. 4 with a first example of a down conversion architecture.

One possible down conversion configuration based on the front end of FIG. 4 is shown in FIG. 5. In this first down conversion architecture, a third 90° hybrid coupler 30 receives the output 25 from the front end. Respective signals in each path 31, 32 from the coupler 30 are combined with the local oscillator signal from the local oscillator 10 in mixers 33, 34 and fed to a fourth 90° hybrid coupler 35 from which the wanted upper and lower sidebands 36, 37 are output. Additional amplifiers and/or filters may be included within the down converter without substantially altering the principle embodied there. The use of two mixers 33, 34 and two 90° hybrids 30, 35 achieves separate conversion of the two sidebands 36, 37. The use of two 90° hybrids 24, 30 near the centre of the block schematic is redundant, allowing the architecture of FIG. 6 to be used instead.

Figure 6:
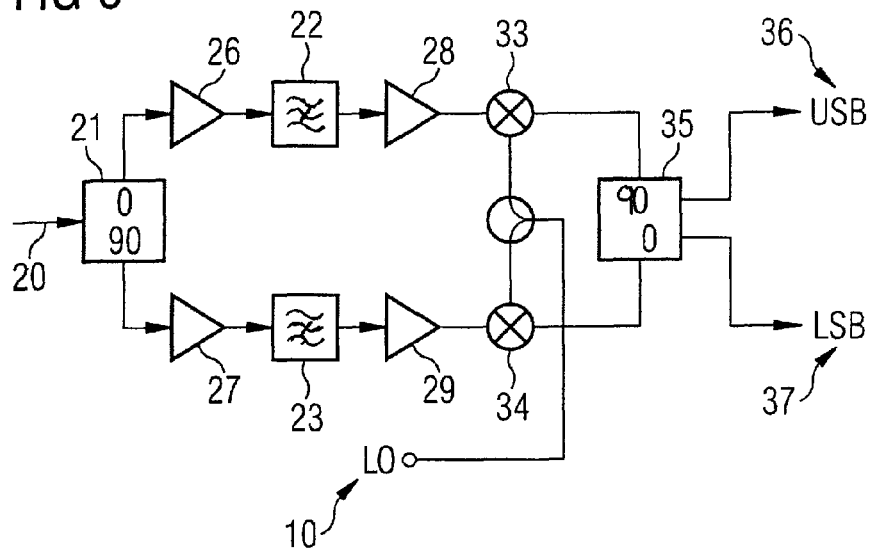
FIG. 6 illustrates the receiver of FIG. 4 with a second example of a down conversion architecture.

In FIG. 6 the second and third hybrid couplers 24, 30 are removed and the outputs from each of the second amplifiers 28, 29 go directly to the mixers 33, 34. The other components of FIG. 6 are as described for FIG. 5. However, apart from some saving in components, this architecture may not be particularly advantageous. The second and third 90° hybrids 24, 30 shown in FIG. 5 serve two different roles. The second hybrid 24 combines signals that have come over two separate paths to create a circuit that is equivalent to a single notch filter and amplifier that is matched at the notch filter centre frequency. The third hybrid 30 serves to obtain two signals of equal amplitude, separated in phase by 90° for the purpose of quadrature mixing. The imperfections (phase, amplitude imbalance) associated with the first notch filter and amplifiers are effectively removed, for the purposes of quadrature mixing, by the second 90° hybrid 24. Thus, although in principle the inclusion of two 90° hybrids 24, 30 is superfluous, it actually serves the important purpose of isolating the imperfections in the circuit before them from the circuit after them.

Figure 7:
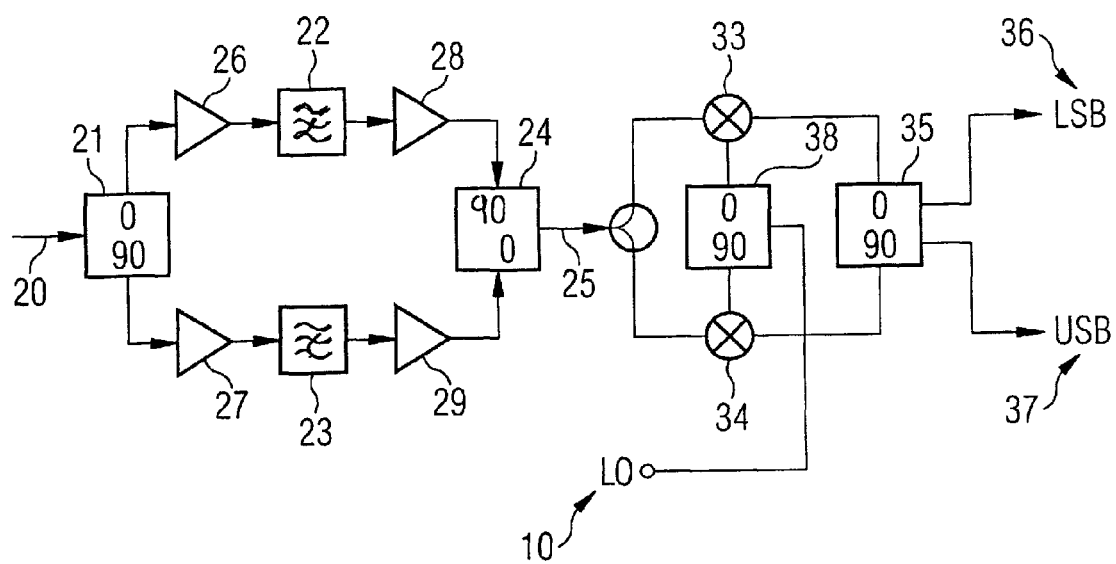
FIG. 7 illustrates the receiver of FIG. 4 with a third example of a down conversion architecture.

An alternative configuration for downconversion is shown in FIG. 7. In this example, the output 25 from the front end of the example of FIG. 4 is split in phase between the two mixers 33, 34 which are themselves coupled to the local oscillator 10 by a hybrid mixer 38. The output of the mixers 33, 34 goes to the fourth hybrid mixer 35 as in the other examples from which lower sidebands 36 and upper sidebands 37 are output. Depending on the details of implementation, the circuits of FIG. 5 or FIG. 7 may be preferred in any given design.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance signal receiver configured for a wireless magnetic resonance imaging system, comprising:
    a pair of substantially identical notch filters, each of said notch filters having an input and an output;
    a first 90° hybrid coupler and a second 90° hybrid coupler, said first 90° hybrid coupler having an input that receives a magnetic resonance signal, and two outputs;
    said second 90° coupler having two inputs and an output; and
    said two outputs of said first 90° coupler being respectively connected to the inputs of said notch filters, and said outputs of said notch filters being respectively connected to said two inputs of said second notch filter.

2. A receiver as claimed in claim 1 comprising an amplifier between said first 90° hybrid coupler and each of said notch filters.

3. A receiver as claimed in claim 1 comprising an amplifier between each of said notch filters and said second 90° hybrid coupler.

4. A receiver as claimed in claim 1 comprising a downconverter connected to the output of said second hybrid coupler.

5. A receiver as claimed in claim 4 wherein said downconverter comprises an input supplied with a local oscillator signal and a pair of mixers that mix said local oscillator signal with a signal at the output of said second hybrid coupler.

6. A receiver as claimed in claim 5 wherein said downstream converter further comprises a third 90° hybrid coupler having two inputs respectively receiving signals from said pair of mixers, and configured to emit respective outputs that are upper and lower sidebands of said magnetic resonance signal.

7. A receiver as claimed in claim 6 wherein said downconverter further comprises a fourth 90° hybrid coupler connected between said second hybrid coupler and said mixers.

8. A receiver as claimed in claim 7 wherein said input is supplied with a local oscillator signal in a frequency range between 2.4 GHz and 2.4835 GHz, and wherein said notch filters each filter out said local oscillator signal at said frequency in a frequency range between 2.4 GHz and 2.4835 GHz.

9. A receiver as claimed in claim 8 wherein said input is supplied with a local oscillator signal at a frequency substantially 2.442 GHz, and wherein each notch filter filters out said local oscillator signal at said frequency of substantially 2.442 GHz.

10. A wireless magnetic resonance imaging system comprising:
    a magnetic resonance data acquisition unit comprising gradient coils, a plurality of local coils, a local oscillator and a receiver; and
    said receiver comprising a pair of substantially identical notch filters, each of said notch filters having an input and an output, a first 90° hybrid coupler and a second 90° hybrid coupler, said first 90° hybrid coupler having an input that receives a magnetic resonance signal, and two outputs, said second 90° coupler having two inputs and an output, and said two outputs of said first 90° coupler being respectively connected to the inputs of said notch filters, and said outputs of said notch filters being respectively connected to said two inputs of said second notch filter.

* * * * *